United States Patent [19]

Lutes

[11] 4,320,341
[45] Mar. 16, 1982

[54] METHOD AND APPARATUS FOR BALANCING THE MAGNETIC FIELD DETECTING LOOPS OF A CRYOGENIC GRADIOMETER USING TRIMMING COILS AND SUPERCONDUCTING DISKS

[75] Inventor: Charles L. Lutes, Farmington, Minn.
[73] Assignee: Sperry Corporation, New York, N.Y.
[21] Appl. No.: 112,897
[22] Filed: Jan. 17, 1980
[51] Int. Cl.³ .......................................... G01R 33/02
[52] U.S. Cl. .................................................. 324/248
[58] Field of Search ...................... 324/248; 307/306; 361/12 D; 323/360; 235/92 D

[56] References Cited

U.S. PATENT DOCUMENTS

3,956,690 5/1976 Rorden .................................. 324/248
3,976,938 8/1976 Hesterman ........................... 324/248

Primary Examiner—Gerard R. Strecker
Assistant Examiner—Walter E. Snow
Attorney, Agent, or Firm—Kenneth T. Grace; Thomas J. Scott; Marshal M. Truex

[57] ABSTRACT

An apparatus for and a method of measuring the difference in intensity between two coplanar magnetic field vector components at two different points in space. The device is comprised of two interconnected, relatively large, loop patterns of opposite, flux cancelling, winding sense. One or both loops include a trimming element that is itself formed of two interconnected, relatively small, loop patterns of opposite, flux cancelling, winding sense. The device is analyzed for imbalance between the two large loops and is then balanced by placing a balancing superconducting disk of the proper characteristic in or near one of the two small loops of the trimming element. The so-trimmed apparatus forms a gradiometer of substantially improved mensuration.

27 Claims, 10 Drawing Figures

Fig. 2

$\partial H_z / \partial Y$

Fig. 1a

$\partial H_x / \partial X$

Fig. 1b

FIELD IN VICINITY OF A SUPERCONDUCTING DISK

*Fig. 3*

PLANAR TRIMMING $\partial B_z / \partial Y$ GRADIOMETER

METHOD AND APPARATUS FOR BALANCING THE MAGNETIC FIELD DETECTING LOOPS OF A CRYOGENIC GRADIOMETER USING TRIMMING COILS AND SUPERCONDUCTING DISKS

BACKGROUND OF THE INVENTION

The detection of very low level voltages, i.e., in the order of $10^{-15}$ volts, has been made possible by the development of supercurrent tunneling across thin insulating barriers as first published by B. D. Josephson in "Possible New Effects In Superconducting Tunneling," Physics Letters 1, Page 251, 1962. The Josephson Effect is a superconducting phenomenon and occurs only at temperatures below a few degrees Kelvin, e.g., 4.5° K., and is used to measure voltages, magnetic fields, magnetic field gradients and magnetic susceptibilities from below audio frequencies to electromagnetic radiation frequencies in the microwave and far infrared. See the article "Josephson Junction Detectors," J. Clarke, Science, 21 June 1974, Volume 184, No. 4143, Pages 1235 through 1242.

More recent studies have been directed toward quantum interference effects in a superconducting ring containing one or two Josephson junctions. These studies have led to the development of the DC and RF SQUID (Superconducting Quantum Interference Device) and the SLUG (Superconducting Low-inductance Undulatory Galvanometer). See the article "Tunnel Junction DC SQUID: Fabrication, Operation and Performance," J. Clarke, et al, Journal of Low Temperature Physics, Volume 25, Nos. 1/2, 1976, Pages 99 through 144. Cryogenic gradiometers, because they use two loop patterns to measure the difference in magnetic field intensities between two points or areas in space, are subject to imbalance primarily due to the differences in loop size and pattern. In the past, balancing has been achieved by adjusting movable superconducting vanes to appropriately distort the magnetic field in the vicinity of the sensor loops. This requires mechanical linkages to adjustment screws external to the dewar. With this procedure, balance is difficult to maintain during thermal cycling and in the presence of mechanical vibrations. The present invention is directed toward an apparatus for and a method of providing balancing without mechanical connection external to the dewar and with permanent mechanical bonding not susceptible to change under mechanical vibration or thermal cycling.

SUMMARY OF THE INVENTION

In the present invention a gradiometer is balanced by inserting a trimming element, which is comprised of two relatively small balancing loops of opposite, flux cancelling, winding sense, in series with but physically external to one of the gradiometer loops. A superconducting disk of the proper characteristics is placed within one of the balancing loops of the trimming element to compensate for measured imbalance of the gradiometer loops. Additional balancing may be achieved by adding an additional superconducting disk in the vicinity of but external to one of the balancing loops and in a plane that is orthogonal to the plane of the balancing loops. Further balancing may be achieved by inserting a second trimming element in one of the gradiometer loops but in a direction that is orthogonal to that of the first trimming element.

DESCRIPTION OF THE PREFERRED EMBODIMENT

Figure 1A:
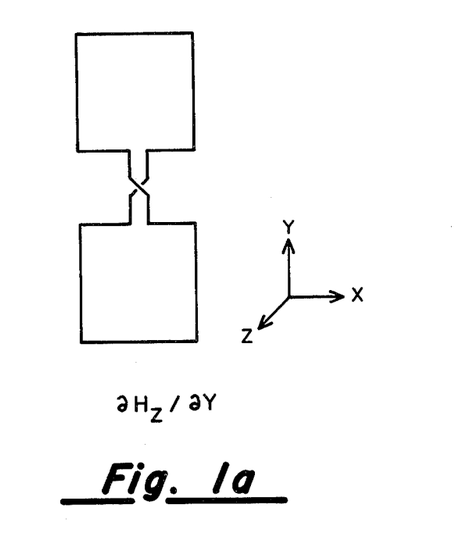
FIGS. 1a, 1b are illustrations of two types of cryogenic gradiometer loop patterns.
Figure 1B:
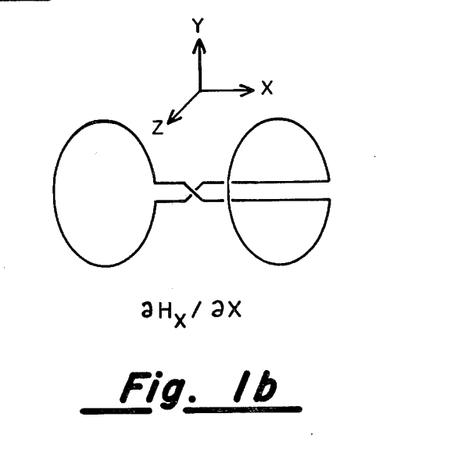

A cryogenic gradiometer consists of two oppositely wound loop patterns configured to measure the difference in the value of a magnetic field vector component ($H_X$, $H_Y$ or $H_Z$) at two different points in space. FIGS. 1a and 1b show two types of gradiometer loop patterns: FIG. 1a is configured to measure the gradient $G_{ZY}=\delta H_Z\delta Y$ and FIG. 1b is configured to measure $G_{XX}=\delta H_X/\delta X$.

The magnetic flux penetrating the loop, which flux is proportional to the loop current, in FIG. 1a is $$\phi = V(G_{ZY}+b_X H_X+b_Y H_Y+b_Z H_Z)$$

where V is a constant volume coefficient dependent upon the loop size and pattern. A perfect gradiometer has values of 0 for the balance coefficients $b_X$, $b_Y$ and $b_Z$. Unequal loop areas caused by manufacturing inaccuracies result in non-zero balance coefficient values. Typical state of the art values of the balance coefficients after manufacture are 4 to 6 orders of magnitude greater than that imposed by application requirements. Electronic cancellation with cryogenic magnetometer outputs can be used to achieve some cancellation but electronic cancellation is not capable of four orders of magnitude or greater.

Figure 2:
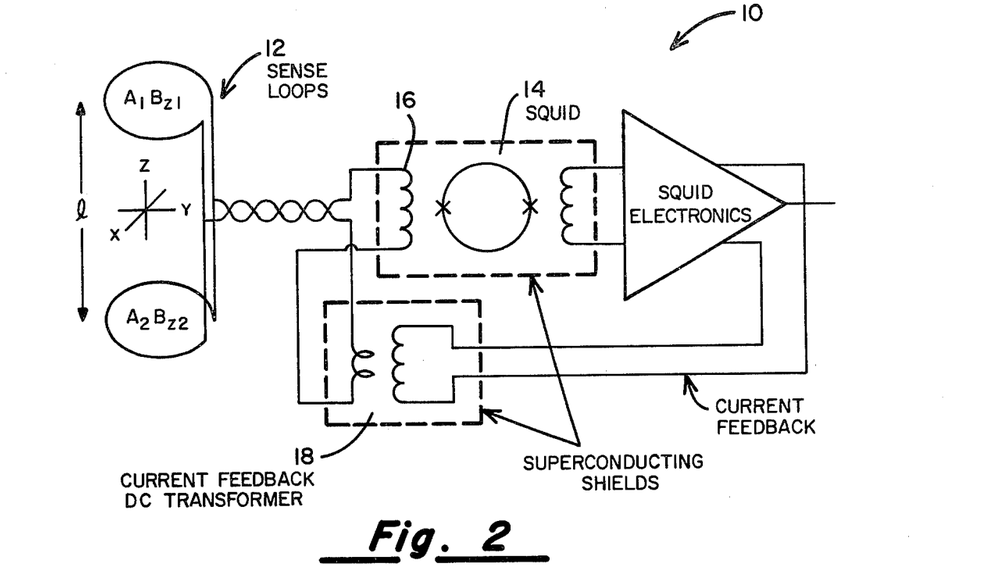
FIG. 2 is a schematic diagram of a single axis gradiometer.

With particular reference to FIG. 2, there is presented a diagrammatic illustration of a single axis gradiometer. In the gradiometer 10, a superconducting sensing loop 12 is intercoupled to the input signal coil 16 of the SQUID 14. A current is induced to flow in the loops 12 by the application of magnetic flux (magnetic field multiplied by the cross-sectional area of the loops). By adjusting the geometry of the coils forming the sensing loops 12, the magnetic flux can be made proportional to a field component, the first derivative of the magnetic field (gradient) or higher order derivatives. This is as taught in the article "Optimization of SQUID Differential Magnetometers," J. P. Wikswo, Jr., AIP Conference Proceedings No. 44, Future Trends in Superconductive Electronics, Page 145, 1978.

In order to understand the element of balance with respect to a gradiometer such as illustrated in FIG. 2, the following is provided. The flux equation for the gradiometer 10 of FIG. 2 is $$\phi_{ZZ} = A_1 B_{Z1} - A_2 B_{Z2}$$

which can be written as $$\phi = (A_1 - A_2) B_{Z0} + \frac{(A_1 + A_2)}{2} \frac{l \partial B_Z}{\partial Z}.$$

If I now identify $$\frac{A_1 + A_2}{2} = \bar{A}, \ A_1 - A_2 = \Delta A, \ \frac{\partial B_Z}{\partial Z} = g_{ZZ}$$

and $$\frac{\phi_{ZZ}}{\bar{A}l} = {}^m g_{ZZ}$$

then $$^m g_{ZZ} = \frac{\Delta A}{\bar{A}l} B_{Z0} + g_{ZZ}.$$

The term $$\frac{\Delta A}{\bar{A}l}$$

is called the imbalance coefficient and behaves as a residual magnetometer noise signal added to the desired gradient signal. In the earth's field, the ratio of $g_{ZZ}/B_{Z0}$ is nominally $1.5 \times 10^{-7}$/ft. If a sensitivity of 3 orders of magnitude on $g_{ZZ}$ is desired, the imbalance coefficient must be $1.5 \times 10^{-10}$/ft. or less.

This degree of balance cannot be achieved purely through accurate manufacture. However, a combination of accurate manufacture, post manufacture calibration and trimming and electronic adjustment can approach this degree of balance. Note that the amount of flux available to be sensed by the sense loops 12 is proportional to $\bar{A}l$, a term I choose to call the volumetric efficiency. The current actually coupled to the input signal coil is $$i_{ZZ} = \frac{\phi_{ZZ}}{L_T}$$

where $L_T$ is the total self-inductance of the sensing loops 12, the DC current transformer 18 and the input signal coil 16 of the SQUID 14.

THE TRIMMING ELEMENT

With any known manufacturing technique, the desired imbalance in a cryogenic gradiometer (the order of $10^{-10}$/ft.) is not achievable. Balance using the best state of the art manufacture techniques will be on the order of $10^{-4}$/ft. and electronic balancing cannot be expected to provide more than four orders of magnitude improvement; a post-manufacture "trimming" technology is required to improve the intrinsic balance of the gradiometer by two to three orders of magnitude.

There are potentially two alternative types of trimming procedures:

1. Modifying the loop structures such that loop areas are actually increased or decreased to effect balance;
2. Distorting the local field so that flux that would normally not pass through a loop will be deflected into the loop, or, vice versa, flux that would normally pass through a loop will be deflected out of the loop.

The second method in which the distortion of the local field is achieved by the placement of small, superconducting disks in the vicinity of the loops is believed to be superior to the first method for the following reasons:

1. The procedure is analytically tractable.
2. A wide, dynamic range of influence is achievable.
3. Corrections can be applied in mutually orthogonal directions with practically no interaxis coupling.
4. Physical trimming of the deposited loops is not necessary, eliminating the potential of producing rough edges with the resultant potential of creating sensor hysteresis.

Figure 3:
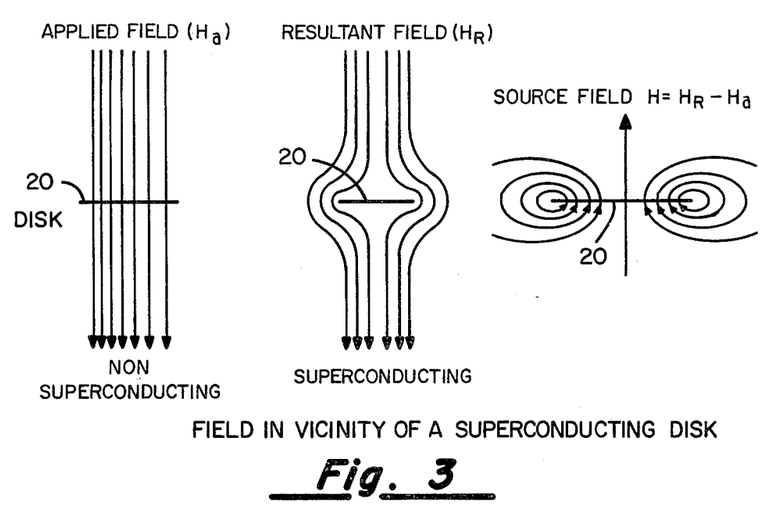
FIG. 3 is an illustration of the magnetic field in the vicinity of a superconducting disk.

Surface currents are generated in superconducting materials in a magnetic field such that lines of flux do not penetrate the superconductor. Thus, a superconducting disk will distort an applied field by effectively repelling lines of flux which would normally penetrate it. FIG. 3 is an illustration of the distortion of the magnetic field due to the superconducting disk 20. The disk 20 can be modeled as a magnetic source having a field (H) equal to the total field with a disk 20 superconducting field ($H_R$) minus the applied field ($H_a$).

By approximating the disk 20 as an oblate spheroid, the vector field potential has been analytically derived. The oblate spheroidal approximation is most accurate for disks having small thickness to diameter ratios ($\rho$). The disks anticipated for use in the trimming element will have a thickness of about one mil and diameters of ten mils or greater yielding values of $\rho = 0.1$ and smaller.

A numerical integration computer program developed for the SPERRY UNIVAC® 1108 Computer System has allowed the computation of the flux produced by the trimming element by means of the defining equation:

$$\phi = \int_c \vec{A} \cdot \vec{dl}.$$

Using this program, calibration curves can be generated for any flux collector structure and trimming disk placement subject to a few constraints.

Figure 4:
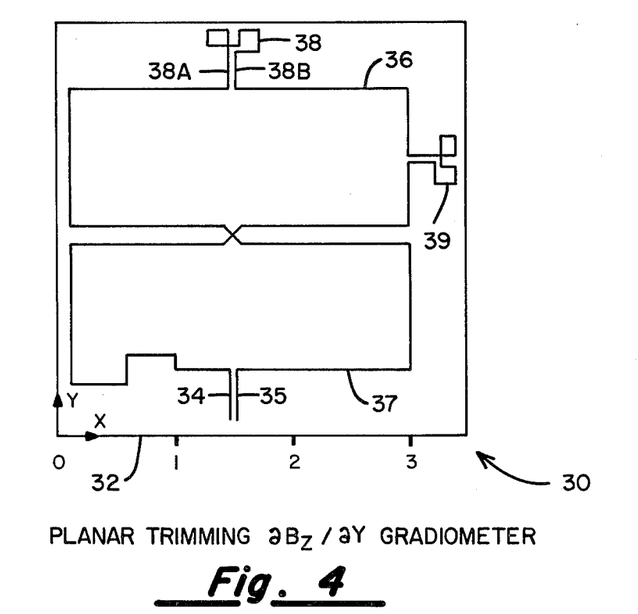
FIG. 4 is an illustration of the loop patterns of a single axis gradiometer incorporating the present invention.

With particular reference to FIG. 4, there is illustrated one example of the trimming approach of the present invention in which a single axis gradiometer 30 is formed upon a 3.5 inch (in) square flat substrate 32. With the X and Y coordinates as shown in FIG. 4 and with the Z coordinate normal to the substrate 32 surface, the gradiometer loops 36, 37 will measure $\delta H_Z/\delta Y$. The SQUID—see FIG. 2—will be connected to the substrate 32 at the point where the two ends 34, 35 of the loop conductor terminate. The two T-shaped trimming elements 38, 39 of the loop 36, one at the top of the figure and the other on the extreme right of the figure, are trimming elements which will be explained in greater detail below.

Figure 5:
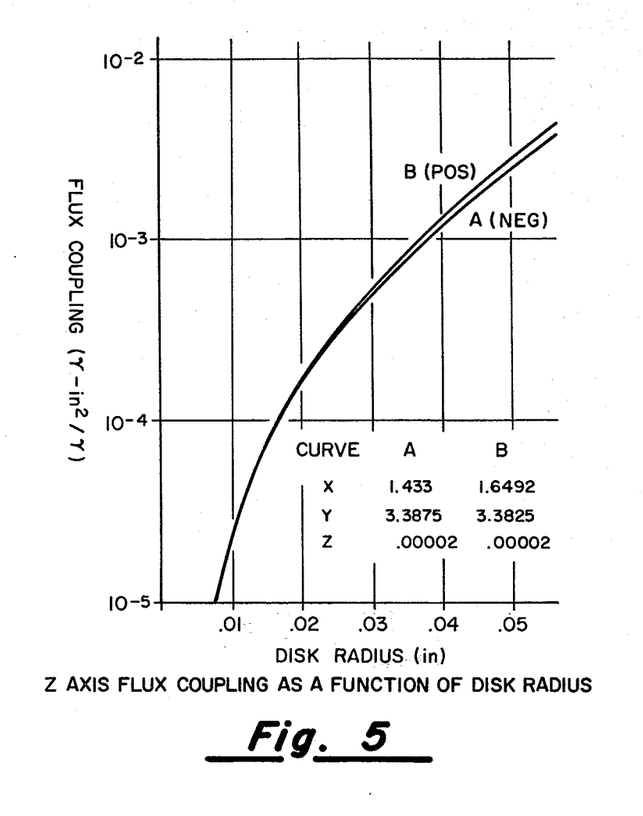
FIG. 5 is a plot of Z axis flux coupling as a function of disk radius.

Trimming is accomplished by placing superconducting disks in the vicinity of the T-shaped trimming element conductor paths. The removal of these trimming elements from within or near the main loops 38, 39 allows isolation of about 30:1. Close inspection of these trimming elements shows that they consist of clockwise and counterclockwise loops separated from the main gradiometer loop 36 by approximately ⅜" and close to the substrate 32 edge. Trimming of an $H_Z$ imbalance is achieved by placing a disk of appropriate size inside one of the loops. The sign of the imbalance determines which loop trimming element is used. Labeling the loops 38A and 38B for the trimming element 38 at the top of FIG. 4 with loop 38A on the left, the amount of imbalance in units of $\gamma\text{-in}^2/\gamma$ generated by a disk placed at the geometric center of each loop 38A, 38B as a function of disk radius, is shown in FIG. 5.

Figure 6:
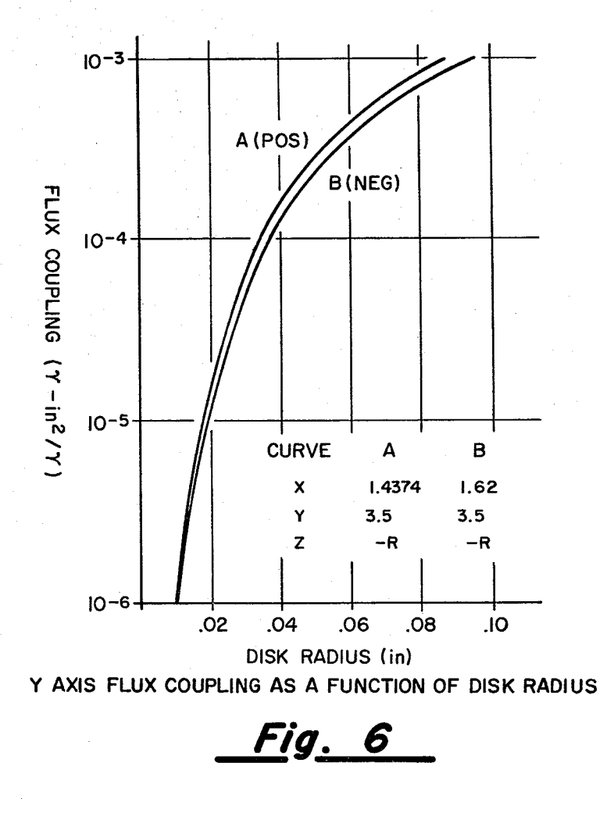
FIG. 6 is a plot of Y axis flux coupling as a function of disk radius.
Figures 7, 9:
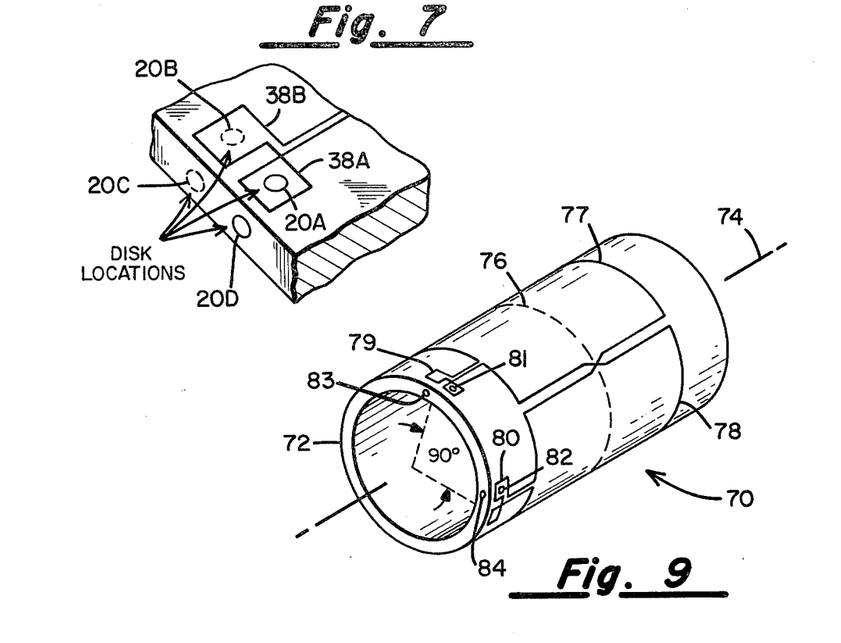
FIG. 7 is a perspective diagrammatic illustration of the orientation of disks in the vicinity of the T-shaped trimming element of the present invention.
FIG. 9 is a perspective diagrammatic illustration of a single-axis gradiometer formed upon the surface of a circular cylinder and incorporating the present invention.

Trimming an imbalance caused by $H_Y$ is accomplished by placing a disk 20C, 20D on the side of the substrate 32 in the vicinity of the trimming elements as illustrated in FIG. 7. The calculated results for such disks are shown in FIG. 6. These results, because the disk is removed some distance from the trimming element rather than enclosed by it, are about an order of magnitude smaller for the same radius. An $H_X$ imbalance is trimmed in the same manner as an $H_Y$ imbalance using trimming element 39. The volumetric efficiency of the sensing loop structure of FIG. 4 is 4.62 in³ which should produce a gradient sensitivity on the order of $$\frac{10^{-4} \gamma \text{rms}}{\text{ft } \sqrt{H_Z}}.$$

Figure 8:
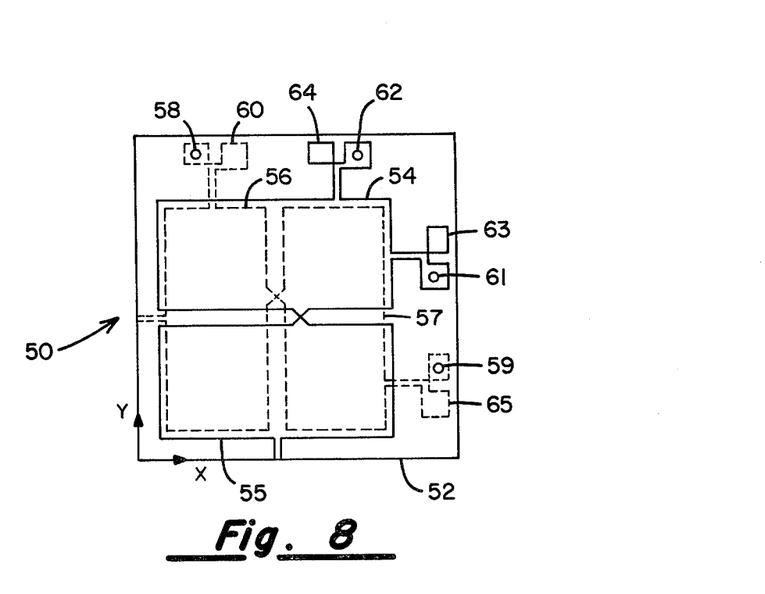
FIG. 8 is an illustration of the loop patterns of a two-axis gradiometer incorporating the present invention.

With particular reference to FIG. 8, there is illustrated an example of the trimming approach of the present invention in which a two-axis gradiometer 50 is formed upon a square, flat substrate 52. As with the embodiment of FIG. 4, with the X and the Y coordinates as shown in FIG. 8 and with the Z coordinate normal to the substrate 52 surface, the gradiometer loops 54, 55 and 56, 57 will measure $H_{Z/Y}$ and $H_{Z/X}$. In this second embodiment, disks 58 and 59, of appropriate size, are placed within the trimming elements 60 and 65 associated with loops 56 and 57 while disks 61 and 62 are placed within the trimming elements 63 and 64 associated with the loop 54.

With particular reference to FIG. 9, there is illustrated a perspective view of a third embodiment of the present invention. In this embodiment, the single axis gradiometer 70 is formed upon the outside surface of a cylinder 72 of circular cross-section having a longitudinal axis 74 and a circular axis 76 around the circumference of the cylinder 72. The cylinder 72 is formed of glass and coated with niobium using magnetron sputtering equipment and then coated with a negative resist. The resist was thin so that dip-coating produced a 1.0 micron (μm) thick layer. This was required to ensure a proper edge definition. An argon laser tuned to 4658 angstroms (Å) was used to expose the resist. The laser beam passed through a pinhole spatial filter, expanded, passed through a square aperture and was focused on the surface of the cylinder. The cylinder was repeatedly stepped at 100 μm intervals until the entire pattern was drawn on the cylinder. At each step, the shutter was opened and the resist was exposed. After development, the niobium was etched using $CF_4 + 4\%\ O_2$ in a barrel-type plasma etcher. Even though this was a manual system using micromanipulators, the precision demonstrated was impressive having a line width variation within ±1.5 μm and the absolute dimensions were ±2.0 μm.

In the illustrated embodiment of the gradiometer 70 of FIG. 9, each of the major loops 77 and 78 has associated therewith a trimming element 79 and 80, and a disk 81 and 82, respectively, which are configured on one end of the cylinder 72 and are oriented radially 90° apart with respect to the longitudinal axis 74 and on the surface of the cylinder 72. Also illustrated are the disks 83 and 84 associated with trimming elements 79 and 80, respectively, such as illustrated in FIG. 7.

In view of the hereinabove disclosure, it is apparent that the present invention provides an apparatus for and a method of trimming a cryogenic gradiometer utilizing T-shaped trimming elements and associated superconducting disks. These trimming elements are capable of trimming out the imbalance in the area of two to three orders of magnitude in a simplified and reliable manner not heretofore available.

The trimming elements have so far been described as dual loop T-shaped structures. The important aspect of these structures is not their exact shape, but:

1. that they encircle the trimming disk which enhances the effectiveness of the trimming disk;
2. that the trimming elements are placed near the substrate edge so that two axes of trimming are achievable with each trimming element;
3. that the trimming elements are at a distance from the main loop structures so that in multiaxis configurations independent trimming of each gradiometer is achievable with minimal trimming coupling between gradiometers.

What is claimed is:

1. A method of balancing a device that measures the difference in magnetic field intensity between first and second points in space that are enclosed by first and second, respectively, superconducting, relatively large, open loop patterns that lie in a first plane, which first and second loop patterns encompass approximately similar areas in said first plane and which are interconnected in series along a first axis in said first plane but which are of opposite, magnetic field cancelling, winding sense, said method comprising:

forming third and fourth superconducting, relatively small, open loop patterns in said first plane that encompass approximately similar areas in said first plane, but which areas are substantially smaller than the areas encompassed by said first and second loop patterns;

forming a first trimming pattern by interconnecting said third and fourth loop patterns in series but of opposite, magnetic field cancelling, winding sense;

interconnecting said interconnected third and fourth loop patterns external to and in series with only one of said first or second loop patterns and along said first axis; and placing a superconducting first disk in said first plane and within said third or fourth loop pattern but not both.

2. In the balancing method of claim 1 further including:

forming fifth and sixth superconducting, relatively small, open loop patterns in said first plane that encompass approximately similar areas in said first plane but which areas are substantially smaller than the areas encompassed by said first and second loop patterns;

forming a second trimming pattern by interconnecting said fifth and sixth loop patterns in series but of opposite magnetic field cancelling, winding sense;

interconnecting said interconnected fifth and sixth loop patterns external to and in series with only one of said first or second loop patterns and along a second axis that is orthogonal to said first axis and in said first plane; and placing a superconducting second disk in said first plane and within said fifth or sixth loop pattern but not both.

3. The balancing method of claim 2 further including forming said first plane into a cylinder having a circular right cross section.

4. The balancing method of claim 3 further including orienting said first axis along a circular right cross section of said cylinder.

5. The balancing method of claim 3 further including orienting said first and second trimming patterns along one end of said cylinder.

6. The balancing method of claim 5 further including interconnecting said first and second trimming patterns to the same one of said first or second loop patterns.

7. The balancing method of claim 5 further including orienting said first and second trimming patterns at a 90° radial distance along one end of said cylinder.

8. The balancing method of claim 1 further included placing a superconducting second disk in a second plane that is orthogonal to said first plane, which second disk is external to said first, second, third and fourth loop patterns but which is in substantial magnetic field coupling with said third or fourth loop pattern but not both.

9. The balancing method of claim 3 further including placing superconducting third and fourth disks in a second plane that is orthogonal to said first plane, which third and fourth disks are external to said first, second, third and fourth loop patterns but which are in substantial magnetic field coupling with said first and second trimming patterns, respectively.

10. A device for measuring the difference in magnetic field intensity between first and second points in space, comprising:
first and second superconducting, relatively large, open loop patterns that lie in a first plane, which first and second loop patterns encompass approximately similar areas in said first plane;
means for interconnecting said first and second loop patterns in series along a first axis in said first plane but of opposite, magnetic field cancelling, winding sense;
first trimming means comprising;
third and fourth superconducting, relatively small, open loop patterns that encompass approximately similar areas but which areas are substantially smaller than the areas encompassed by said first and second loop patterns and which third and fourth loop patterns are also in said first plane,
means for interconnecting said third and fourth loop patterns in series for forming a first trimming pattern in which said third and fourth loop patterns are of opposite, magnetic field cancelling, winding sense;
means for interconnecting said interconnected third and fourth loop patterns in series with only one of said first or second loop patterns and along said first axis;
second trimming means, comprising;
fifth and sixth superconducting, relatively small, open loop patterns that encompass approximately similar areas but which areas are substantially smaller than the areas encompassed by said first and second loop patterns and which fifth and sixth loop patterns are also in said first plane,
means for interconnecting said fifth and sixth loop patterns in series for forming a second trimming pattern in which said fifth and sixth loop patterns are of opposite, magnetic field cancelling, winding sense;
means for interconnecting said interconnected fifth and sixth loop patterns in series with only one of said first or second loop patterns and along a second axis, which is orthogonal to said first axis;
a first superconducting disk placed in said first plane and within the third or fourth loop pattern of said first trimming means but not both; and,
a second superconducting disk placed in said first plane and within the fifth or sixth loop pattern of said second trimming means but not both;
said first and second trimming means substantially balancing said first and second loop patterns.

11. The device of claim 10 in which said first plane is that of a cylinder having a circular right cross section.

12. The device of claim 11 in which said first axis is along a circular right section of said cylinder.

13. The device of claim 12 in which said first and second trimming means are oriented along one end of said cylinder.

14. The device of claim 10 in which said first and second trimming means are interconnected to the same one of said first or second loop patterns.

15. The device of claim 10 in which first and second trimming means are interconnected to different ones of said first and second loop patterns.

16. The device of claim 11 in which said first and second trimming means are oriented at a 90° radial distance along one end of said cylinder.

17. The device of claim 16 further including superconducting third and fourth disks that lie in a second plane, which second plane is orthogonal to said first plane, which third and fourth disks are external to said first, second, third, fourth, fifth and sixth loop patterns but which are in substantial magnetic field coupling with said first and second trimming means, respectively.

18. In a device for measuring the difference in magnetic field intensity between first and second points in space that are enclosed by first and second superconducting, relatively large, open loop patterns, respectively, that lie in a first plane, which first and second loop patterns encompass approximately similar areas in said first plane and which first and second loop patterns are interconnected in series along a first axis in said first plane but of opposite, magnetic field cancelling, winding sense, a trimming device for balancing said first and second loop patterns comprising:
third and fourth superconducting, relatively small, open loop patterns that encompass approximately similar areas but which areas are substantially smaller than the areas encompassed by said first and second loop patterns and which third and fourth loop patterns lie in said first plane;
means for interconnecting said third and fourth loop patterns in series in a first trimming pattern but of opposite, magnetic field cancelling, winding sense;
means for interconnecting said interconnected third and fourth loop patterns external to and in series with only said first loop pattern and along said first axis; and, a superconducting first disk that lies in said first plane and within said third or fourth loop pattern but not both.

19. In the device of claim 18, said trimming device further including:
fifth and sixth, superconducting, relatively small, open loop patterns that encompass approximately similar areas but which are substantially smaller than the areas encompassed by said first and second loop patterns and which fifth and sixth loop patterns lie in said first plane;
means for interconnecting said fifth and sixth loop patterns in series in a second trimming pattern but of opposite, magnetic field cancelling, winding sense; and,
means for interconnecting said interconnected fifth and sixth loop patterns external thereto and in series with only said second loop pattern and along said first axis; and,
a superconducting second disk in said first plane and within said fifth or sixth loop pattern but not both.

20. The trimming device of claim 19 in which said first plane is that of a cylinder having a circular right cross section.

21. The trimming device of claim 20 in which said first axis is along a circular right cross section of said cylinder.

22. The trimming device of claim 20 in which said first and second trimming patterns are oriented along one end of said cylinder.

23. The trimming device of claim 22 in which said first and second trimming patterns are interconnected to a different one of said first and second loop patterns.

24. The trimming device of claim 23 in which said first and second trimming patterns are oriented at a 90° radial distance along one end of said cylinder.

25. The trimming device of claim 18 further including a superconducting second disk that is in a second plane, which is orthogonal to said first plane, which second plane second disk is external to said first, second, third and fourth loop patterns but which is in substantial magnetic field coupling with said third or fourth loop pattern but not both.

26. The trimming device of claim 20 further including superconducting third and fourth disks that lie in a second plane which second plane is orthogonal to said first plane, which third and fourth disks are external to said first, second, third and fourth loop patterns but which are in substantial magnetic field coupling with said first and second trimming patterns, respectively.

27. A method of balancing a device that measures the difference in magnetic field intensity between first and second points in space that are enclosed by first and second, respectively, superconducting, relatively large, open loop patterns that lie in a first plane, which first and second loop patterns encompass approximately similar areas in said first plane and which are interconnected in series along a first axis in said first plane but which are of opposite, magnetic field cancelling, winding sense, said method comprising:
forming third and fourth superconducting, relatively small, open loop patterns in said first plane that encompass approximately similar areas in said first plane, but which areas are substantially smaller than the areas encompassed by said first and second loop patterns;
forming a first trimming pattern by interconnecting said third and fourth loop patterns in series in a first T-shaped loop pattern but of opposite, magnetic field cancelling, winding sense;
interconnecting said interconnected third and fourth loop patterns external to and in series with only one of said first or second loop patterns;
placing a superconducting first disk in said first plane and within only one of said third or fourth loop patterns;
forming fifth and sixth superconducting, relatively small, open loop patterns in said first plane that encompass approximately similar areas in said first plane, but which areas are substantially smaller than the areas encompassed by said first and second loop patterns;
forming a second trimming pattern by interconnecting said fifth and sixth loop patterns in series in a second T-shaped loop pattern but of opposite, magnetic field cancelling, winding sense;
interconnecting said interconnected fifth and sixth loop patterns external to and in series with only one of said first or second loop patterns;
placing a superconducting second disk in said first plane and within only one of said fifth or sixth loop patterns; and,
placing superconducting third and fourth disks in a second plane orthogonal to said first plane and external to said first, second, third, fourth, fifth and sixth loop patterns but in substantial magnetic field coupling with only said first and second T-shaped loop patterns, respectively.

* * * * *

UNITED STATES PATENT AND TRADEMARK OFFICE
CERTIFICATE OF CORRECTION

PATENT NO. : 4,320,341

DATED : 3-16-82

INVENTOR(S) : C. L. Lutes

It is certified that error appears in the above-identified patent and that said Letters Patent are hereby corrected as shown below:

Column 9, Line 42, after "which", first occurrence, add -- second plane --.

Column 9, Line 42, after "which", second occurrence, delete -- second plane --.

Signed and Sealed this

Eighteenth Day of May 1982

[SEAL]

Attest:

Attesting Officer

GERALD J. MOSSINGHOFF

Commissioner of Patents and Trademarks